United States Patent [19]

Kusakabe et al.

[11] Patent Number: 4,964,969
[45] Date of Patent: Oct. 23, 1990

[54] SEMICONDUCTOR PRODUCTION APPARATUS

[75] Inventors: Kenji Kusakabe; Keiji Yamauchi, both of Itami, Japan

[73] Assignee: Mitsubishi Denki Kabushiki Kaisha, Japan

[21] Appl. No.: 405,432

[22] Filed: Sep. 11, 1989

[30] Foreign Application Priority Data

Jun. 9, 1989 [JP] Japan .................................. 1-145091

[51] Int. Cl.⁵ .............................................. C23C 14/34
[52] U.S. Cl. ............................. 204/298.12; 204/298.13
[58] Field of Search .................... 204/192.12, 298 TX, 204/298 TC, 298 NH, 298.12, 298.13, 298.15

[56] References Cited

U.S. PATENT DOCUMENTS

| | | | |
|---|---|---|---|
| 3,620,957 | 11/1971 | Crawley et al. | 204/298 TS |
| 4,209,375 | 6/1980 | Gates et al. | 204/298 TS |
| 4,290,876 | 9/1981 | Nishiyama et al. | 204/298 TS |
| 4,341,816 | 7/1982 | Lauterbach et al. | 204/298 TS |
| 4,448,652 | 5/1984 | Pachonik | 204/298 TS |
| 4,569,745 | 2/1986 | Nagashima | 204/298 TS |

Primary Examiner—Nam X. Nguyen
Attorney, Agent, or Firm—Leydig, Voit & Mayer

[57] ABSTRACT

A semiconductor production apparatus employs a target prepared by using a solder alloy which has a limited Sn content. The solder alloy can form an alloy layer having large elongation between a metal target and a backing plate to prevent undesirable cracking and separation of target, whereby a semiconductor device can be produced with a high degree of reliability.

2 Claims, 12 Drawing Sheets

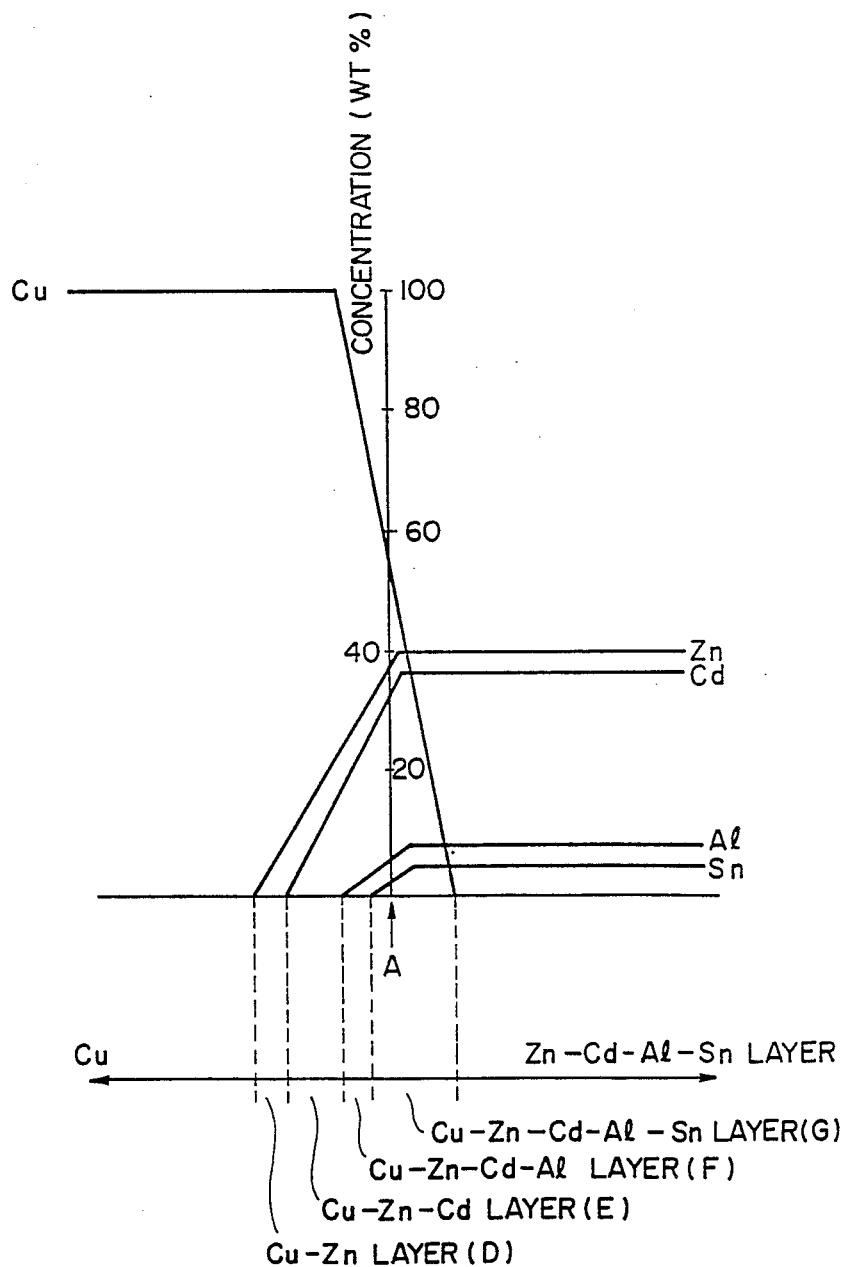

SEMICONDUCTOR PRODUCTION APPARATUS

BACKGROUND OF THE INVENTION

1. Field of the Invention

The present invention relates to a semiconductor production apparatus and a target device for use in the semiconductor production apparatus.

2. Description of the Related Art

FIG. 1 schematically shows a sputtering apparatus which is conventionally used in production of semiconductors. In FIG. 1, the sputtering apparatus 1 has a chamber 2 for maintaining therein an atmosphere of a predetermined reduced pressure. The chamber 2 accommodates a target 3 and a semiconductor wafer 4 which is supported by a support member 5 opposite the target 3.

In operation, Ar gas is introduced into the chamber 2 through a valve 6a while the chamber 2 is continuously evacuated through the valve 6b so that the atmosphere in the chamber 2 is held at a pressure level which generally ranges between 0.13 and 6.7 Pa ($1 \times 10^{-3}$ Torr to $5 \times 10^{-2}$ Torr). The target 3, a cathode, is supplied with D.C. power or high-frequency A.C. power from a power supply 7, so that a glow discharge is commenced in the chamber 2. As a result of the glow discharge, the Ar gas is ionized to Ar+ ions which are attracted to and impinge upon the target 3, which is biased to a negative potential, whereby the target 3 is sputtered. Particles 8 of the material of the target 3, coming out the target 3 as a result of the sputtering are deposited on the semiconductor wafer 4 which opposes the target 3. The target 3 is heated to, for example, 200 to 300° C. as a result of the sputtering, so that it must be cooled by, for example, water from the side 9 thereof opposite to the wafer 4. The mean free path of the particles 8 coming out the target 3 is comparatively small and most of the particles 8 collide with one another and are scattered before reaching the semiconductor wafer 4. This type of sputtering apparatus therefore exhibits superior detouring in the particles 8, as well as high degree of uniformity of thickness of the film formed by the sputtering.

FIGS. 2(a) to 2(d) are schematic illustrations of the target 3, e.g., a copper target, used in the sputtering apparatus of the type described, in different steps of a process for forming the target 3. The target 3 is formed by bonding a metal target 10 to a backing plate 12 through a solder 11, e.g., a solder composed of 95 wt% of Sn and 5 wt% of Ag (see FIG. 2(a)). More specifically, the metal target 10 and the backing plate 12 are superposed through the intermediary of the solder 11. Then, the solder 11 is melted by a suitable heating means such as a heater (not shown) to become molten solder 11a (see FIG. 2(c)) and then the solder 11 is solidified to become solidified solder 11b (see FIG. 2(d)), whereby a target 3 is prepared as shown in FIG. 2(b).

FIG. 3 is a graph showing the distributions of concentrations of metal elements diffused in the region around the interfaces between the solder 11 and the metal target 10 or the backing plate 12. In this Figure, the ordinate represents the concentrations of the metal elements, while the abscissa represents the distance from the interface A. As will be seen from this Figure, the metal diffused by the heat during melting of the solder 11 causes the metal elements to diffuse and form alloy layers such as Cu-Sn layer B and Cu-Sn-Ag layer C in the region around the interface A.

Thus, the target 3 shown in FIG. 2(a) has a Cu-Sn-Ag layer C formed on each side of the solder 11 and a Cu-Sn layer B formed on the side of each Cu-Sn-Ag layer C opposite to the solder 11, as schematically shown in FIG. 4. In general, Cu-Sn alloys exhibit impractically small elongation, i.e., large brittleness, when the Sn content is 25wt% or greater, as will be seen from FIG. 8 which shows mechanical properties of this type of alloys. In FIG. 8, curves A, B and C show tensile strength, elongation and hardness, respectively. Due to the large brittleness, the Cu-Sn layer tends to crack as denoted by 13 in FIG. 5 as a result of thermal expansion of the target 3 and thermal impact during sputtering.

Such a crack 13 formed in the Cu-Sn layer B may undesirably allow the metal target 10 to come off the backing plate 12. In addition, when the sputtering of the target 3 is continued after separation of the metal target 10, impurities are undesirably incorporated into the semiconductor wafer 4.

SUMMARY OF THE INVENTION

Accordingly, an object of the present invention is to provide a semiconductor production apparatus which can prevent a metal target from coming off the backing plate to enable a highly reliable production of a semiconductor film, thereby overcoming the above-described problems of the prior art.

To this end, according to one aspect of the present invention, there is provided a semiconductor production apparatus comprising: a chamber; means for supporting a semiconductor wafer in the chamber; a target disposed in the chamber opposite the semiconductor wafer; and means for ionizing argon gas charged in the chamber and causing the argon ions to impinge upon the target thereby causing the semiconductor wafer to be sputtering with particles emitted from the target, wherein the target has a backing plate, a metal target and a solder alloy layer through which the backing plate and the metal target are bonded together, the solder alloy layer being formed of an alloy containing up to 40 wt% of zinc (Zn), up to 5 wt% of tin (Sn), up to 8 wt% of aluminum (Al), up to 0.2 wt% of impurities, and a balance cadmium (Cd).

According to another aspect of the present invention, there is provided a target for use in a semiconductor production apparatus, comprising a backing plate; a metal target; and a solder alloy layer through which the backing plate and the metal target are bonded together, the solder alloy layer being formed of an alloy containing up to 40 wt% of zinc (Zn), up to 5 wt% of tin (Sn), up to 8 wt% of aluminum (Al), up to 0.2 wt% of impurities, and the balance of cadmium (Cd).

According to still another aspect of the present invention, there is provided a solder alloy for use in a target formed of an alloy comprising: up to 40 wt% of zinc (Zn), up to 5 wt% of tin (Sn), up to 8 wt% of aluminum (Al), up to 0.2 wt% of impurities; and the balance of cadmium (Cd).

BRIEF DESCRIPTION OF THE DRAWINGS

FIG. 11 is a graph of the concentration distributions of metal elements in the region around the interface between a solder alloy layer and a metal target or a backing plate.

DESCRIPTION OF THE PREFERRED EMBODIMENTS

Figure 1:
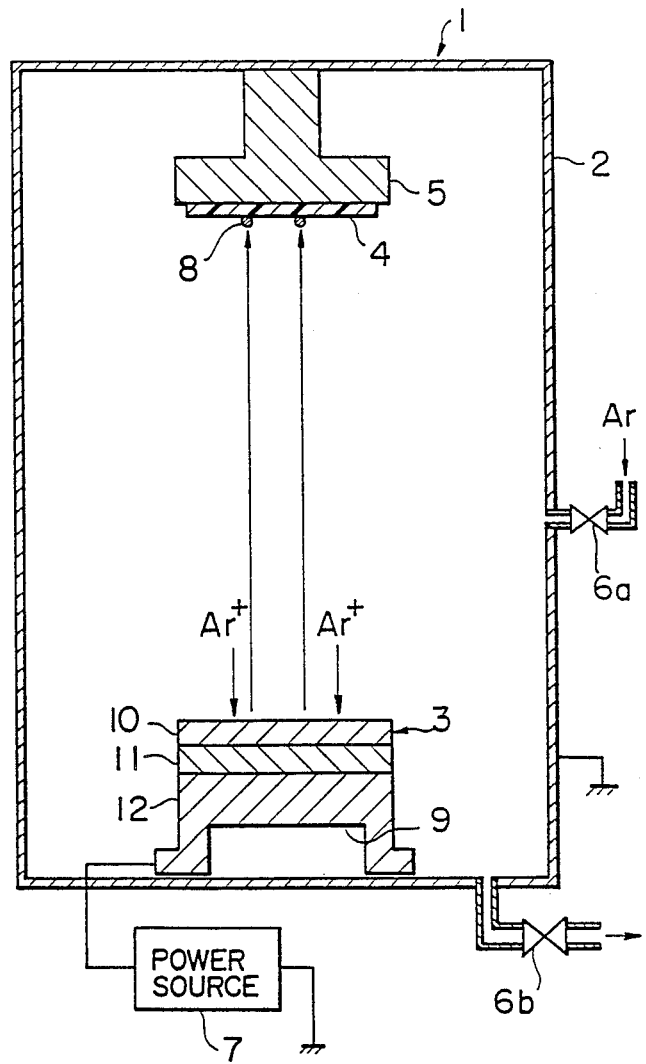
FIG. 1 is a schematic illustration of a conventional semiconductor production apparatus.
Figure 2A:
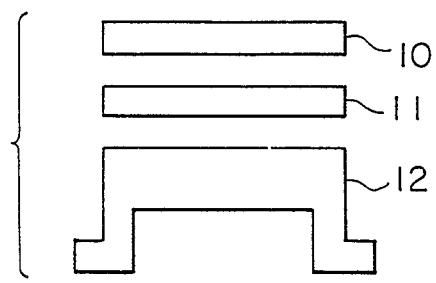
FIGS. 2(a) to 2(d) are schematic side elevational views of a target for use in conventional semiconductor production apparatus, showing the target in different steps of preparation.
Figure 2B:
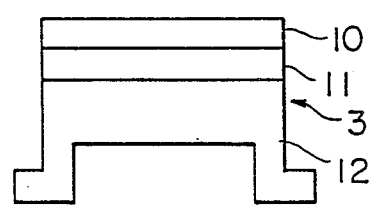
Figure 2C:
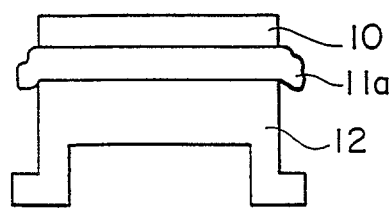
Figure 2D:
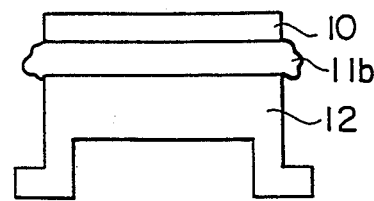
Figure 3:
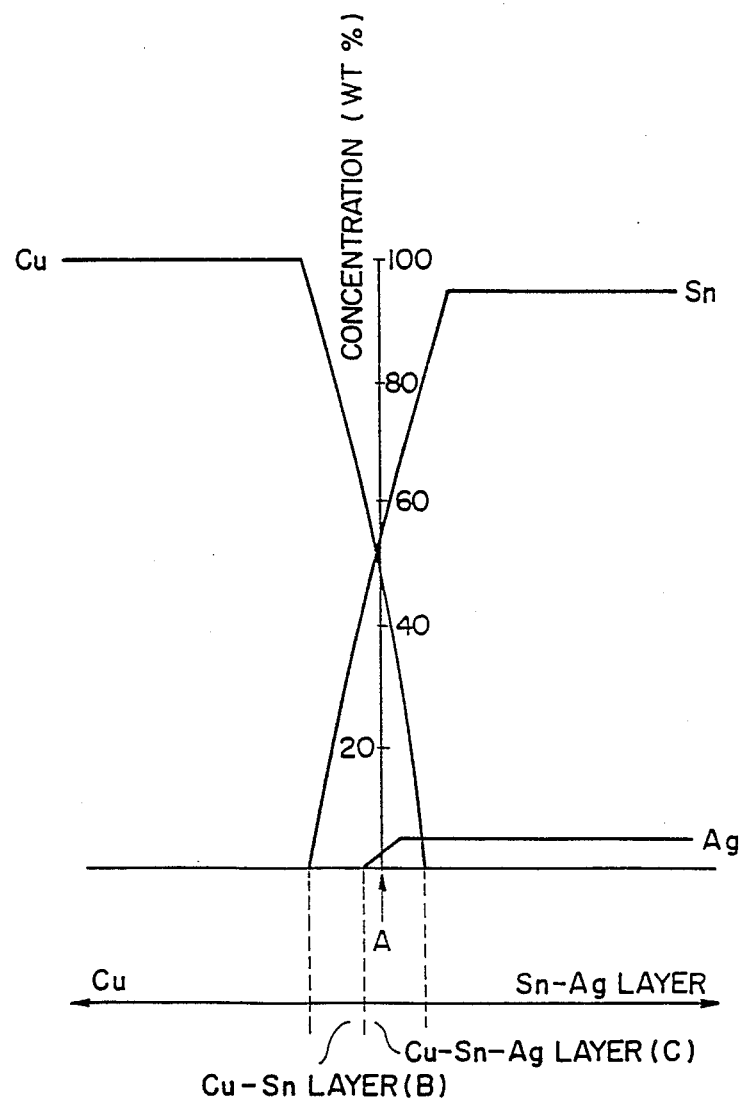
FIG. 3 is a graph showing the distributions of metal elements in the region around the interface between a solder alloy and a metal target or a backing plate.
Figure 4:
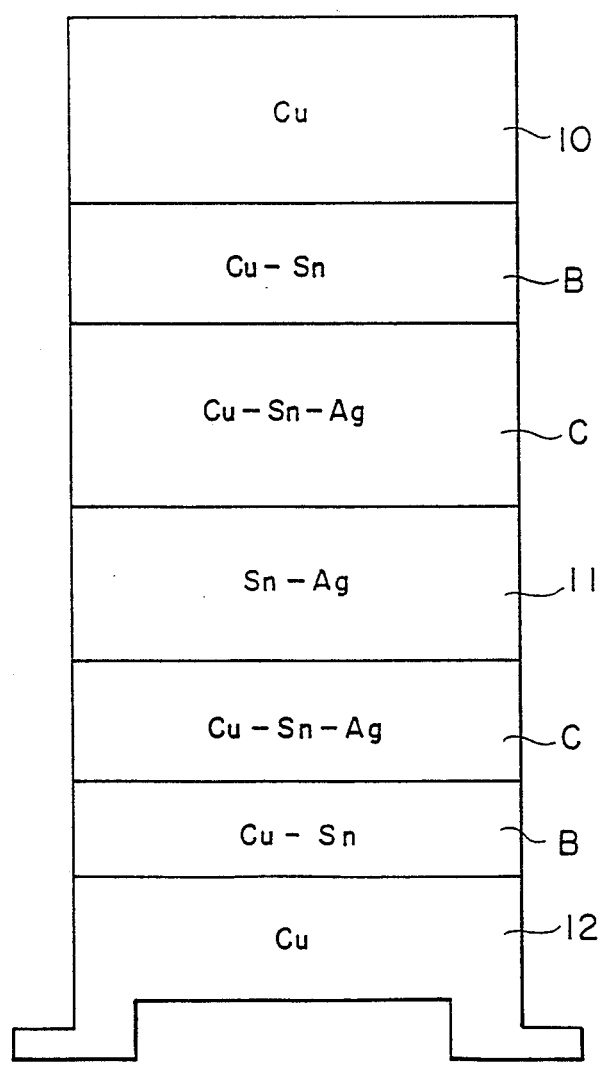
FIG. 4 is a schematic side elevational view illustrating layers of a target including various alloy layers.
Figure 5:
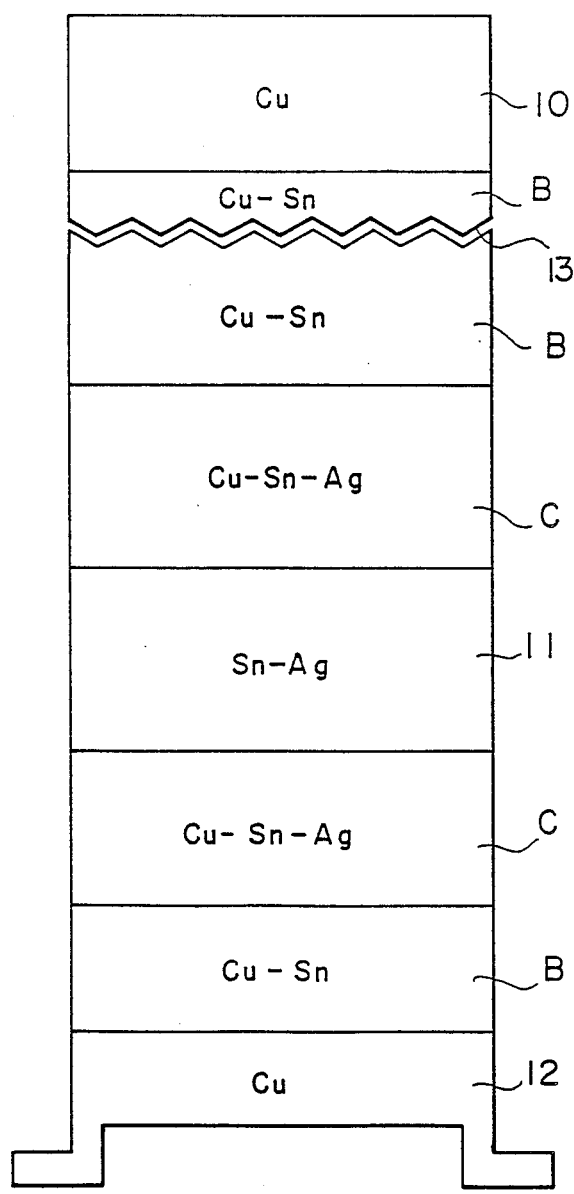
FIG. 5 is a schematic side elevational view of a target, illustrating a crack formed in an alloy layer.
Figure 6:
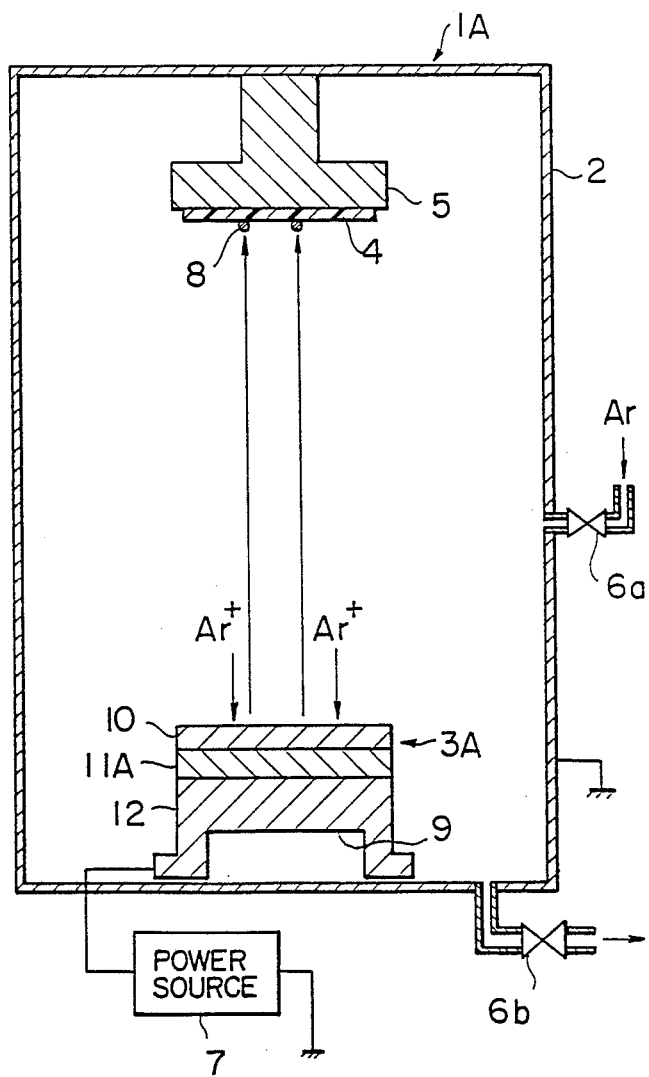
FIG. 6 is a schematic illustration of an embodiment of the semiconductor production apparatus in accordance with the present invention.

FIG. 6 is a schematic illustration of a sputtering apparatus as an embodiment of the semiconductor production apparatus of the present invention. In FIG. 6, reference numerals 2 and 4 to 9 denote the same parts or members as those in the conventional sputtering apparatus shown in FIG. 1. Namely, a sputtering apparatus, generally denoted by 1A, has a target 3A which is disposed in a chamber 2. A semiconductor wafer 4 supported by a supporting member 5 is disposed in the chamber 2.

In operation, Ar gas is introduced into the chamber 2 through a valve 6a while the chamber 2 is continuously evacuated through the valve 6b so that the atmosphere in the chamber 2 is held at a pressure level which generally ranges between 0.13 and 6.7 Pa ($1 \times 10^{-3}$ Torr to $5 \times 10^{-2}$ Torr). The target 3A, which serves as a cathode, is supplied with D.C. power or high-frequency A.C. power from a power supply 7, so that a glow discharge is commenced in the chamber 2. As a result of the glow discharge, the Ar gas is ionized to Ar+ ions which are attracted to and impinge upon the target 3A which is biased to a negative potential, whereby the target 3A is sputtered. Particles 8 of the material of the target 3A, coming out the target 3A as a result of the sputtering, are deposited on the semiconductor wafer 4 which opposes the target 3A. The target 3A is heated to, for example, 200 to 300° C. as a result of the sputtering, so that it must be cooled by, for example, water from the side 9 thereof opposite to the wafer 4.

Figure 7:
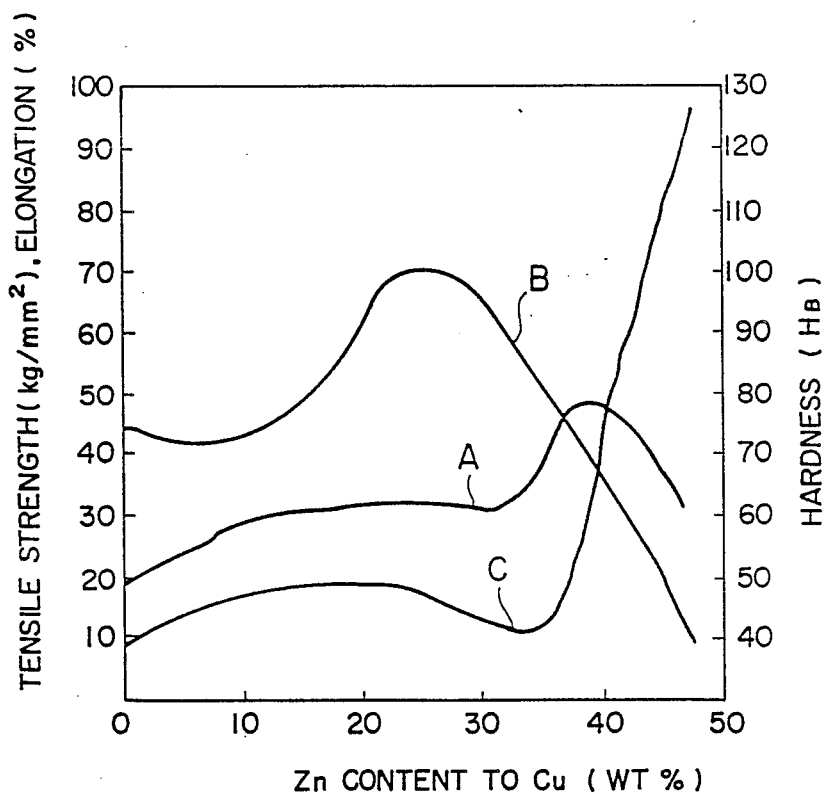
FIG. 7 is a diagram showing mechanical properties of Cu-Zn alloys.
Figure 8:
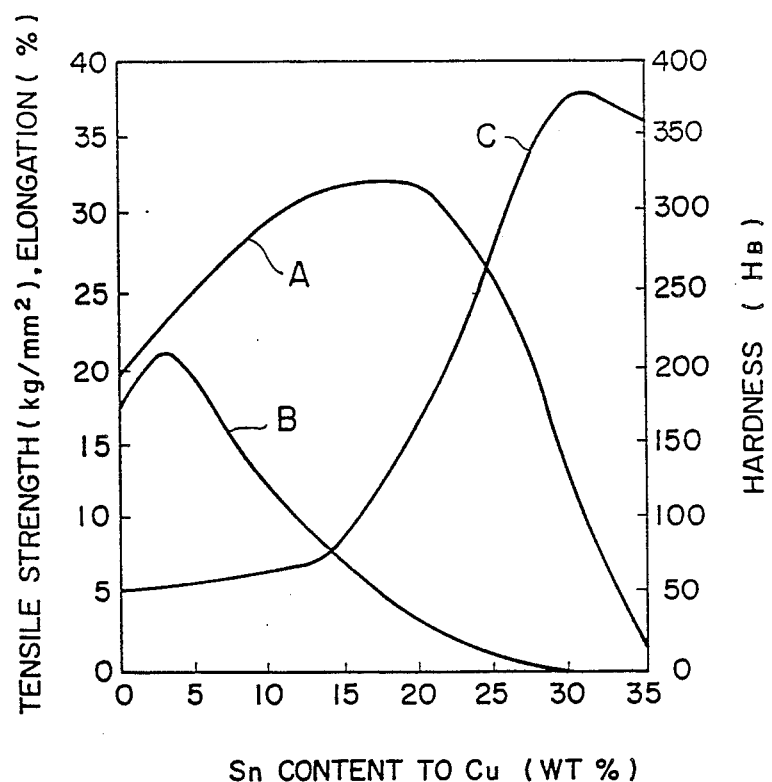
FIG. 8 is a diagram showing mechanical properties of Cu-Sn alloys.
Figure 9:
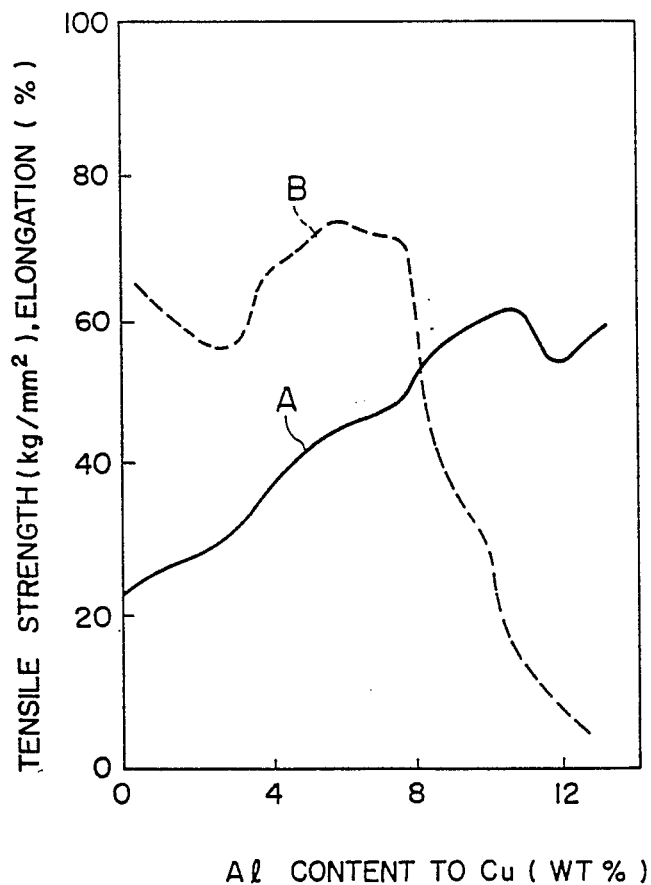
FIG. 9 is a diagram showing mechanical properties of Cu-Al alloys.

The target 3A is formed by bonding a metal target 10 and a backing plate 12 through a solder 11A. Preferably, the solder 11A is made of an alloy which contains, not more that 40% of zinc (Zn, up to 5 wt% of tin (Sn, up to 8 wt% of aluminum (Al), up to 0.2 wt% of inevitable impurities, and the balance substantially cadmium (Cd). The addition of up to 40 wt% of zinc provides a large elongation of the alloy as shown in FIG. 7 so that any risk of cracking or separation in the target 3A during sputtering can be avoided. In FIGS. 7 to 9, curves A, B and C represent, respectively, tensile strength, elongation and hardness of the alloys. As will be seen from FIG. 8, the Sn content is preferably up to 5 wt%, because such a Sn content provides superior tensile strength and elongation. It is also preferred that the Al content is up to 8 wt% because such an Al content offers high tensile strength and, in particular, large elongation. Inclusion of up to 0.2 wt% of impurities is inevitable in the presently available solder preparation processes.

Figure 10A:
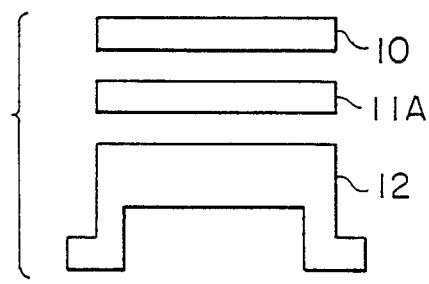
FIGS. 10(a) to 10(d) are schematic side elevational views of a target used in the semiconductor production apparatus of the present invention.
Figure 10B:
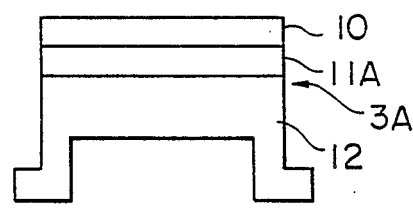
Figure 10C:
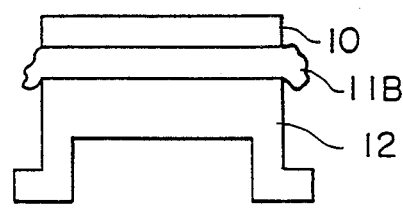
Figure 10D:
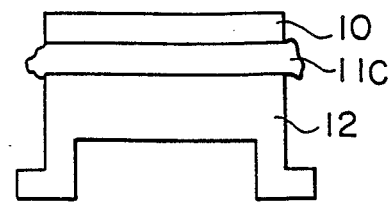

FIGS. 10(a) to 10(d) are schematic side elevational views of the target 3A, e.g., a copper-based target, suitable for use in the sputtering apparatus 1A described hereinbefore. A description will be given of a process for producing the target 3A, which employs a solder 11A made of an alloy containing, for example, 5 wt% of Sn, 8 wt% of Al, 37 wt% of Cd and 40 wt% of Zn. A metal target 10, solder 11A and a backing plate 12 are stacked in layers as shown in FIG. 10(b) and the solder 11A is heated by a suitable heating means such as a heater (not shown) so as to become molten solder 11B. Then, a pressure is applied to the stacked layers 10, 11B and 12 so that the interfaces between the metal target 10 and the molten solder 11B and between the molten solder 11B and the backing plate 12 are sufficiently wetted, as shown in FIG. 10(c). Then, while maintaining a close and wetting contact between the metal target 10 and the molten solder 11B and between the molten solder 11B and the backing plate 12, the heater 12 is stopped to solidify, the molten solder 11B as solidified solder 11C. The metal target 10 and the backing plate 12 are securely bonded through the solidified solder 11C, whereby the target 3A is obtained as shown in FIG. 10(d). FIG. 11 is a graph showing the distributions of concentrations of metal elements diffused in the interface between the metal target 10 and the solder 11A or between the backing plate 12 and the metal solder 11A. In this figure, the ordinate represents concentrations of metal elements, while the abscissa represents the distance from the interface A. As will be seen from FIG. 11, the metals are diffused by the heat applied for melting the solder 11A and form alloy layers such as a Cu-Zn layer D, Cu-Zn-Cd layer E, Cu-Zn-Cd-Al layer F and Cu-Zn-Cd-Al-Sn layer G in the region around the interface.

Figure 12:
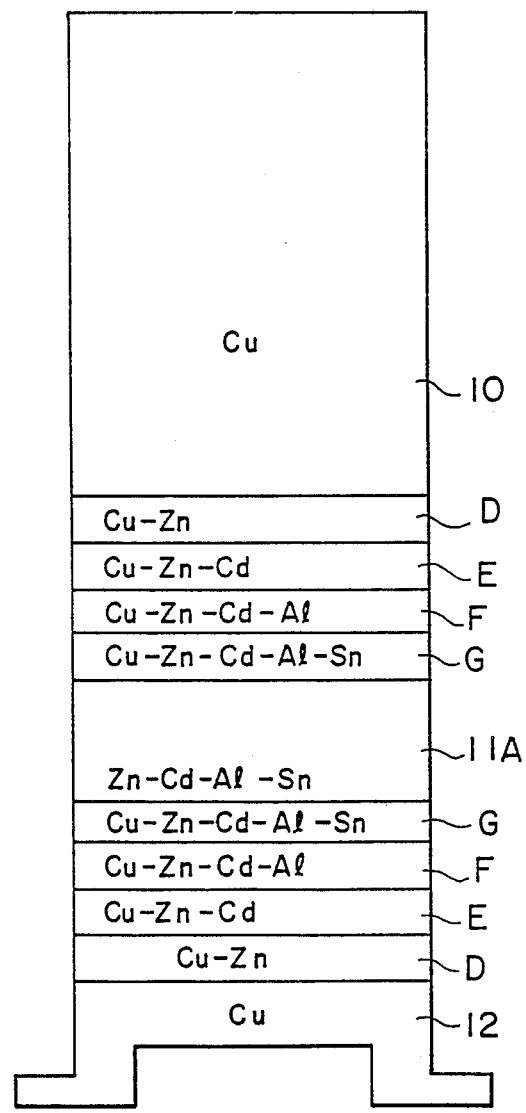
FIG. 12 is a schematic side elevational view illustrating layers of a target including various alloy layers.

In consequence, the target 3A shown in FIG. 10(d) has a Cu-Zn-Cd-Al-Sn layer G on each side of the solder 11A, and other alloy layers such as Cu-Zn-Cd-Al layer F, Cu-Zn-Cd layer E and Cu-Zn layer D which are formed in the mentioned order as shown in FIG. 12. The Cu-Zn layer D exhibits a tensile strength substantially equal to that of Cu and an elongation which is about twice as large as that of Cu, as will be seen from the following table. This layer, therefore, effectively prevents the metal target 10 from coming off the backing plate 12 due to thermal expansion and thermal impact applied during the sputtering.

| Mechanical Strength of Metals | | | |
|---|---|---|---|
| | Hardness ($H_B$) | Elongation (%) | Tensile Strength (Kg/mm$^2$) |
| Cu | 50 | 20 | 35 |
| Cu-Sn Layer | 200 | 10 | 25 |
| Cu-Zn Layer | 10 | 45 | 25 |

Although Cu was used as the metal target 10 in the described embodiment, this is only illustrative and various other metals such as Au, Ti, Ni, W-Si, Mo-Si, Al-Si and so forth can be used equally well as the metal target 10. Separation of the metal target 10 is avoided also when one of such metals is used as the metal target 10, because in such a case the formation of brittle Cu-Sn layer does not take place in the region around the interface between the metal target 10 and the solder 11A.

What is claimed is:

1. A semiconductor producing apparatus comprising:
   a chamber;
   means for supporting a semiconductor wafer in said chamber;
   means for supporting a semiconductor wafer in said chamber;
   a target disposed in said chamber opposite said means for supporting a semiconductor wafer; and
   means for ionizing a gas charged in said chamber and causing the gas ions to impinge upon and sputter said target wherein said target has a backing plate, a metal target, and a solder layer through which said backing plate and said metal target are bonded together wherein said solder layer is an alloy consisting of 10 to 40wt% of zinc (Zn), up to 5 wt% of tin (Sn), up to 8 wt% of aluminum (Al), up to 0.2 wt% of impurities, and the balance substantially of cadmium (Cd).

2. A target for use in a semiconductor production apparatus comprising:
   a backing plate;
   a metal target; and
   a solder alloy larger through which said backing plate and said metal target are bonded together wherein said solder layer is an alloy consisting of 10 to 40 wt% of zinc (Zn), up to 5 wt% of tin (Sn), up to 8 wt% of aluminum (Al), up to 0.2 wt% of impurities, and the balance of cadmium (Cd).

* * * * *

UNITED STATES PATENT AND TRADEMARK OFFICE
CERTIFICATE OF CORRECTION

PATENT NO. : 4,964,969

DATED : October 23, 1990

INVENTOR(S) : Kusakabe et al.

It is certified that error appears in the above-identified patent and that said Letters Patent is hereby corrected as shown below:

Column 5, lines 13-14, delete.

Column 6, line 12, change "alloy larger" to --layer--.

Signed and Sealed this

Thirty-first Day of March, 1992

Attest:

HARRY F. MANBECK, JR.

Attesting Officer

Commissioner of Patents and Trademarks